(12) United States Patent
Li et al.

(10) Patent No.: US 12,471,389 B2
(45) Date of Patent: Nov. 11, 2025

(54) SOLAR CELL, METHOD FOR PREPARING THE SAME, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Huimin Li, Zhejiang (CN); Menglei Xu, Zhejiang (CN); Jie Yang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/595,876

(22) Filed: Mar. 5, 2024

(65) Prior Publication Data

US 2025/0221089 A1   Jul. 3, 2025

(30) Foreign Application Priority Data

Dec. 28, 2023 (CN) .......................... 202311849878.8

(51) Int. Cl.
*H10F 10/14* (2025.01)
*H10F 19/80* (2025.01)
(Continued)

(52) U.S. Cl.
CPC ........... *H10F 10/146* (2025.01); *H10F 19/80* (2025.01); *H10F 19/90* (2025.01); *H10F 77/215* (2025.01);
(Continued)

(58) Field of Classification Search
CPC ..... H01L 31/022458; H01L 31/022441; H01L 31/02363; H01L 31/048; H01L 31/05;
(Continued)

(56) References Cited

U.S. PATENT DOCUMENTS

2013/0125971 A1* 5/2013 Kim ................. H10F 10/14
257/E31.127
2014/0020752 A1* 1/2014 Arimoto ............. H01L 31/0747
438/96
(Continued)

FOREIGN PATENT DOCUMENTS

CN         206643506 U        11/2017
CN         210897302 U         6/2020
(Continued)

OTHER PUBLICATIONS

Jinko Solar (Haining) Co., Ltd., Cn First Office Action with English Translation, CN 202311706460.1, Jan. 25, 2024, 18 pgs.
(Continued)

*Primary Examiner* — Lindsey A Buck
(74) *Attorney, Agent, or Firm* — USCH Law, PC

(57) ABSTRACT

Provided are a solar cell, a method for preparing a solar cell, and a photovoltaic module, relating to the field of photovoltaics. The solar cell includes a substrate, a dielectric layer and a doped semiconductor layer which are stacked, a passivation layer, and electrodes. The substrate has a first surface. The first surface includes an edge region and a center region. The edge region surrounds the center region. The edge region is substantially flush with or closer to the second surface than the center region. The dielectric layer is formed over the center region. The passivation layer covers the edge region and a surface of the doped semiconductor layer facing away the dielectric layer. The electrodes are located in the center region, and penetrate the passivation layer in a thickness direction to be in electrical contact with the doped semiconductor layer.

14 Claims, 9 Drawing Sheets

(51) Int. Cl.
*H10F 19/90* (2025.01)
*H10F 77/20* (2025.01)
*H10F 77/30* (2025.01)
*H10F 77/70* (2025.01)

(52) U.S. Cl.
CPC ......... *H10F 77/227* (2025.01); *H10F 77/311* (2025.01); *H10F 77/703* (2025.01)

(58) Field of Classification Search
CPC .... H10F 77/215; H10F 77/703; H10F 77/311; H10F 10/146; H10F 19/80
See application file for complete search history.

(56) References Cited

U.S. PATENT DOCUMENTS

| | | | | |
|---|---|---|---|---|
| 2016/0155866 A1* | 6/2016 | Ha | ................. | H10F 77/1645 |
| | | | | 136/255 |
| 2016/0197210 A1* | 7/2016 | Hayashi | ........ | H01L 31/022458 |
| | | | | 136/251 |
| 2019/0326457 A1* | 10/2019 | Chung | ................. | H01L 31/1804 |
| 2020/0279968 A1 | 9/2020 | Bende et al. | | |
| 2022/0393044 A1* | 12/2022 | Qiu | ................. | H01L 31/0682 |

FOREIGN PATENT DOCUMENTS

| | | |
|---|---|---|
| CN | 112164728 A | 1/2021 |
| CN | 112635617 A | 4/2021 |
| CN | 112885925 A | 6/2021 |
| CN | 113611776 A | 11/2021 |
| CN | 111509090 B | 5/2022 |
| CN | 218975459 U | 5/2023 |
| JP | 2016048799 A | 4/2016 |
| JP | 2016122847 A | 7/2016 |
| JP | 2019091919 A | 6/2019 |

OTHER PUBLICATIONS

Jinko Solar (Haining) Co., Ltd., CN Second Office Action with English Translation, CN 202311706460.1, Feb. 21, 2024, 19 pgs.
Zhejiang Jinko Solar Co., Ltd., et al., Extended European Search Report, EP 24161482.5, Aug. 21, 2024, 31 pgs.

* cited by examiner

SOLAR CELL, METHOD FOR PREPARING THE SAME, AND PHOTOVOLTAIC MODULE

CROSS REFERENCE TO RELATED APPLICATIONS

The present application claims the benefit of priority under the Paris Convention to Chinese Patent Application No. CN202311849878.8, filed on Dec. 28, 2023, which is incorporated by reference herein in its entirety.

TECHNICAL FIELD

The various embodiments described in this document relate to the field of photovoltaics, and more specifically to a solar cell, a method for preparing the same, and a photovoltaic module.

BACKGROUND

At present, with the gradual depletion of fossil energy, a solar cell, as a new energy alternative, is becoming more and more widely used. The solar cell is a device for converting light energy of the sun into electric energy. The solar cell generates carriers by using the photovoltaic effect principle and introduces the carriers out by using an electrode, which is beneficial to the effective utilization of the electric energy.

For a tunnel oxide passivated contact (TOPCon) cell or a TBC (TOPCon-BC) cell formed by an interdigitated back contact (IBC) cell combined with a TOPCon technology, an ultra-thin tunneling oxide layer and a highly-doped polycrystalline silicon layer need to be prepared on a silicon surface. Chemical passivation of the tunneling oxide layer and field passivation of the polycrystalline silicon layer can significantly reduce a recombination rate of minority carriers on the silicon surface, while the highly-doped polycrystalline silicon layer can significantly improve the conductivity of majority carriers, which is beneficial to improving the open circuit voltage and filling coefficient of the cell.

Low pressure chemical vapor deposition (LPCVD) is a main technology to prepare the tunneling oxide layer and the polycrystalline silicon layer, has the advantages of low cost, high yield, and high performance of prepared thin films, and has been widely used at present. However, in the process of preparing the polycrystalline silicon layer by LPCVD, there may exist some problems, thereby affecting the cell efficiency. For example, incomplete removal and over-etching exist in the process of removing a silicon glass layer formed due to oxidation of the polycrystalline silicon layer.

SUMMARY

Embodiments of the present disclosure provide a solar cell, a preparation method of a solar cell, and a photovoltaic module, which are at least beneficial to improving the photoelectric conversion efficiency of the solar cell.

According to some embodiments of the present disclosure, a solar cell is provided in an aspect of the embodiments of the present disclosure. The solar cell includes a substrate, a dielectric layer, a doped semiconductor layer, a passivation layer, and electrodes. The substrate has a first surface and a second surface opposite to the first surface. The first surface includes an edge region and a center region. The edge region surrounds the center region. The edge region is substantially flush with, or closer to the second surface than, the center region. The dielectric layer is formed over the center region. The doped semiconductor layer is formed over a surface of the dielectric layer facing away from the substrate. The passivation layer is formed over the edge region and a surface of the doped semiconductor layer facing away from the dielectric layer. The electrodes include a first plurality of electrodes formed in the center region and penetrating the passivation layer in a thickness direction to be in electrical contact with the doped semiconductor layer.

In some embodiments, the substrate has a first boundary. The center region has a second boundary facing the edge region. The first boundary and the second boundary form opposite boundaries of the edge region. A distance between the second boundary and the first boundary is less than 300 µm.

In some embodiments, the substrate has a textured structure in the edge region, and the passivation layer covers the textured structure.

In some embodiments, the textured structure includes a tower base structure, a pyramid structure, or a platform raised structure.

In some embodiments, the substrate has a recessed depth in the edge region with respect to the center region in a range of 1.5 µm to 15 µm.

In some embodiments, a height difference between a top of the textured structure and the center region is in a range of 1 µm to 14 µm.

In some embodiments, the center region includes P-regions and N-regions arranged alternatingly, and spacer regions. Each respective spacer region of the spacer regions is between a respective P-region of the P-regions and a respective N-region of the N-regions, and the doped semiconductor layer includes a first doped semiconductor layer over the P-regions and a second doped semiconductor layer over the N-regions. The electrodes include first electrodes and second electrodes, the first electrodes are in electrical contact with the first doped semiconductor layer, and the second electrodes are in electrical contact with the second doped semiconductor layer. The passivation layer further covers a surface of the substrate in the spacer regions.

In some embodiments, the substrate is provided with a first textured structure in the edge region, and the substrate is provided with a second textured structure in the respective spacer region. The first surface has a roughness in the edge region greater than or equal to that in the respective spacer region.

In some embodiments, the spacer region is substantially flush with the P-region and the N-region. Alternatively, the respective spacer region is closer to the second surface than the respective P-region, and is closer to the second surface than the respective N-region.

In some embodiments, the solar cell further includes an emitter. The emitter is formed over the second surface.

In some embodiments, the electrodes further include a second plurality of electrodes that are formed in the edge region and penetrate the passivation layer in a thickness direction to be in electrical contact with the edge region.

In some embodiments, the electrodes further include a third plurality of electrodes, where each of the third plurality of electrodes includes a first portion and a second portion arranged along a first direction. The first portion is located in the center region. The second portion is located in the edge region. The first direction is an extension direction of the electrodes.

In some embodiments, the doped semiconductor layer includes at least one of a doped amorphous silicon layer, a doped polycrystalline silicon layer, a doped microcrystalline silicon layer, a doped silicon carbide layer, or a doped crystalline silicon layer.

According to some embodiments of the present disclosure, a photovoltaic module is further provided in still another aspect of the embodiments of the present disclosure. The photovoltaic module includes at least one cell string, at least one encapsulation glue film and at least one cover plate. Each cell string is formed by connecting the solar cells according to any one of the foregoing embodiments. Each encapsulation glue film is configured to cover a surface of a respective cell string. Each cover plate is configured to cover a surface of a respective encapsulation glue film facing away from the at least cell string.

BRIEF DESCRIPTION OF THE DRAWINGS

One or more embodiments are described by way of example with reference to the corresponding figures in the accompanying drawings, and the exemplary description is not to be construed as limiting the embodiments. Unless otherwise particularly stated, the figures in the accompanying drawings are not drawn to scale. To describe the technical solutions of the embodiments of the present disclosure or the related art more clearly, the accompanying drawings that need to be used in the embodiments are briefly described below. Apparently, the accompanying drawings in the following description show only some embodiments of the present disclosure, and a person of ordinary skill in the art may still derive other drawings from these accompanying drawings without creative efforts.

DETAILED DESCRIPTION OF THE EMBODIMENTS

Figure 1:
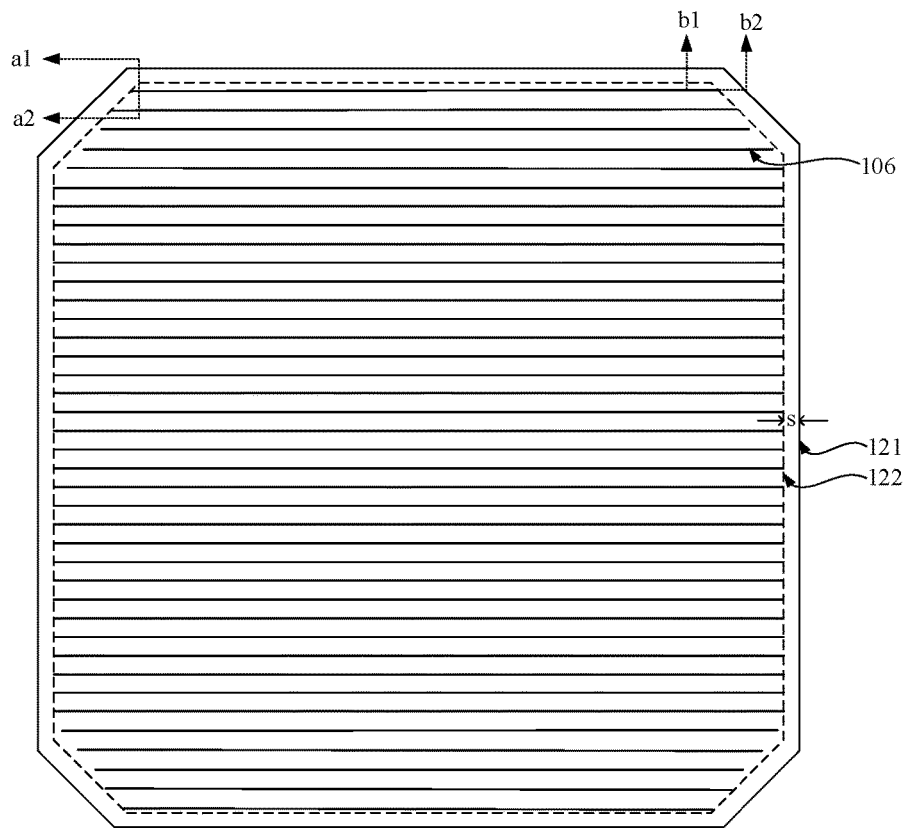
FIG. 1 is a schematic diagram illustrating a structure of a solar cell in accordance with an embodiment of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

In the drawings, the thickness of layers and an area has been enlarged for better understanding and case of description. When it is described that a part, such as a layer, film, area, or substrate, is "over" or "on" another part, the part may be "directly" on another part or a third part may be present between the two parts. In contrast, when it is described that a part is "directly on" another part, it means that a third part is not present between the two parts. Furthermore, when it is described that a part is "generally" formed on another part, it means the part is not formed on the entire surface (or front surface) of another part and is also not formed in part of the edge of the entire surface.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

As can be known from the BACKGROUND, the photoelectric conversion efficiency of current solar cells is poor.

One of the reasons for the poor photoelectric conversion efficiency of solar cells was found through analysis to be that the current process of forming a semiconductor layer with a P-type doped element or an N-type doped element is generally carried out using the LPCVD process for deposition, including: first deposition for forming an intrinsic semiconductor film; second deposition for providing the intrinsic semiconductor film with the doped element; and oxidation. In this case, it is inevitable to form a doped silicon glass layer on surfaces of the formed doped semiconductor layer and substrate (emitter). When the doped silicon glass layer on the surface of the substrate (emitter) is removed, a protective layer is formed on the surface of the doped semiconductor layer to reduce damage to the doped semiconductor layer. It was found in the study that when the entire substrate is placed in an etching solution, the etching solution may etch part of the surface of the doped semiconductor layer through a side surface of the substrate since there is no protective layer formed on the side surface of the substrate, resulting in more surface defects of the doped semiconductor layer, thus affecting the improvement of the photoelectric conversion efficiency.

Embodiments of the present disclosure provide a solar cell. In the solar cell, a substrate is divided into an edge region and a center region, and then film layers in the edge region and the center region are designed differently, thus avoiding the problem of over-etching of the edge region and ensuring larger electrical performance of the center region. The edge region is flush with or lower than the center region, and a passivation layer covers the edge region and a surface of a doped semiconductor layer facing away from the dielectric layer, so that the surface defects and flatness at an edge can be reduced, and the edge of a cell can be fully and effectively passivated. In this way, the electrical recombination and leakage at the edge of the cell can be reduced, and the open circuit voltage and short circuit current of the cell can be improved, thus improving the photoelectric conversion efficiency of the cell.

Embodiments of the present disclosure will be described in detail below with reference to the accompanying drawings. However, a person of ordinary skill in the art will appreciate that in various embodiments of the present disclosure, many technical details are provided for better understanding of the present disclosure. However, the technical solutions claimed to be protected by the present disclosure may also be implemented even without the technical details and various changes and modifications based on the following embodiments.

Figure 2:
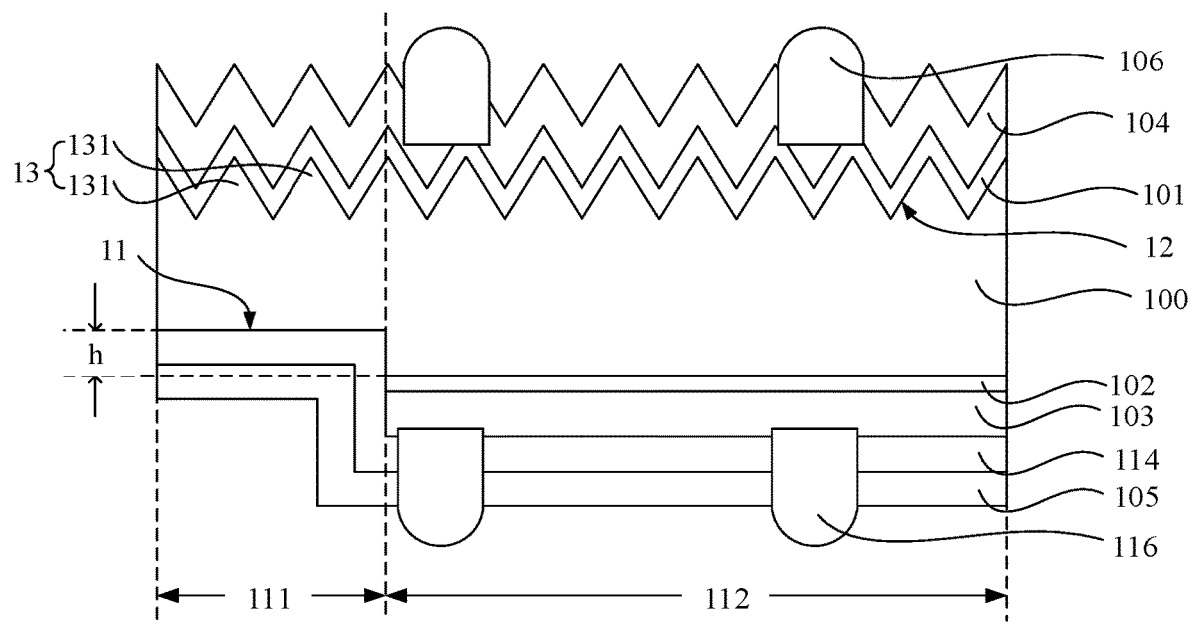
FIG. 2 is a schematic diagram illustrating a first cross-sectional structure of FIG. 1 along a1-a2.
Figure 3:
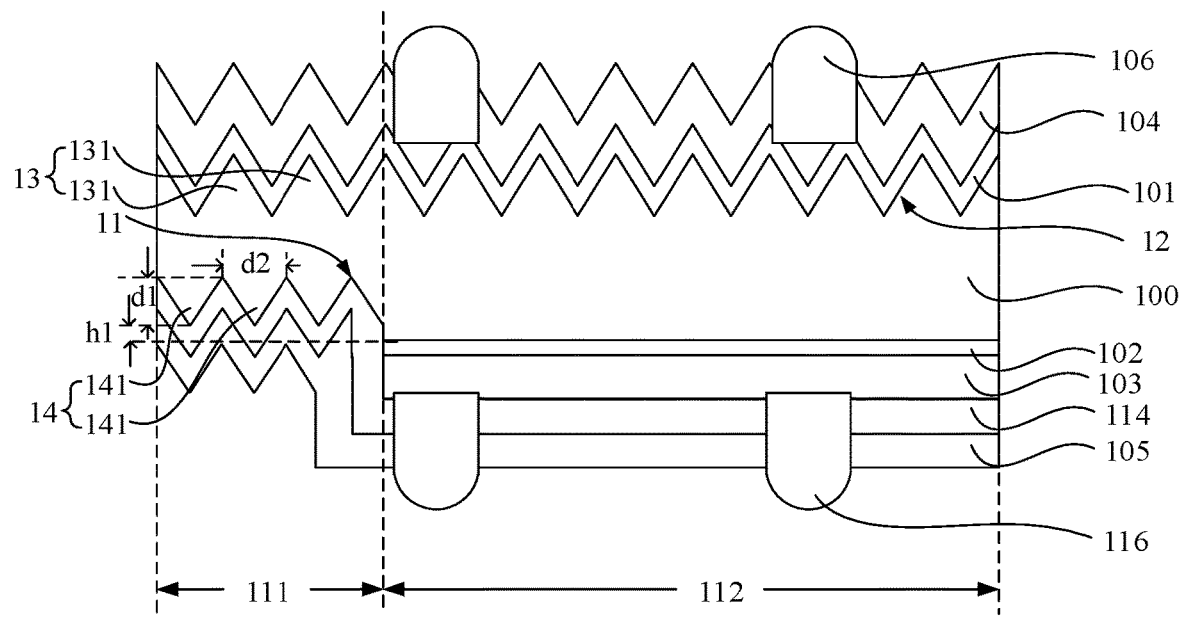
FIG. 3 is a schematic diagram illustrating a second cross-sectional structure of FIG. 1 along a1-a2.
Figure 4:
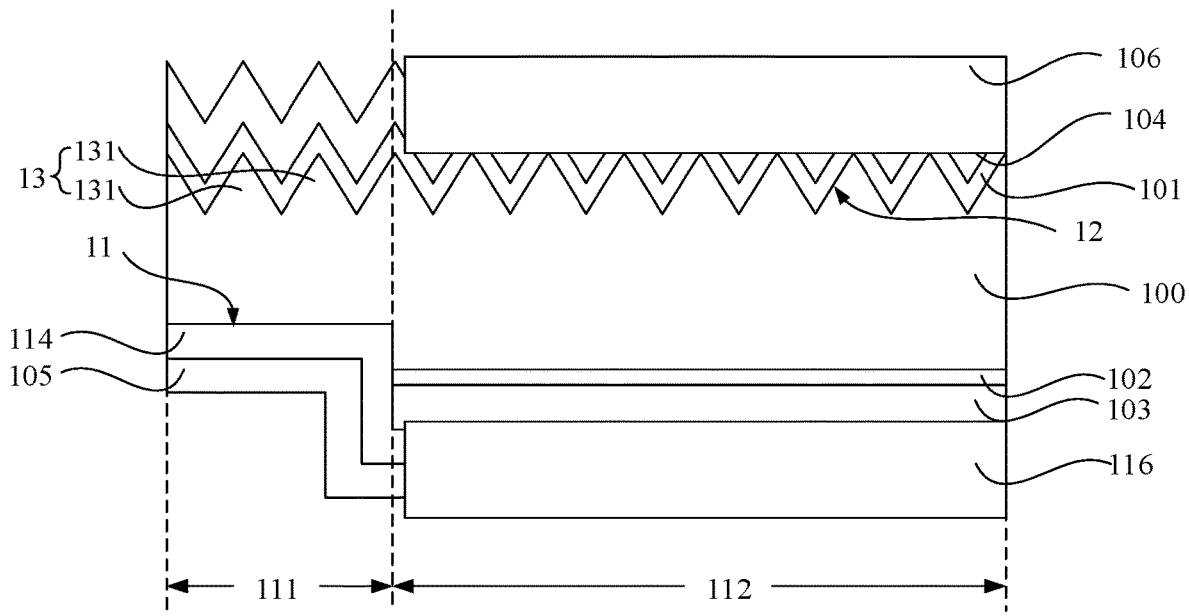
FIG. 4 is a schematic diagram illustrating a cross-sectional structure of FIG. 1 along b1-b2.

FIG. 1 is a schematic diagram illustrating a structure of a solar cell in accordance with an embodiment of the present disclosure. FIG. 2 is a schematic diagram illustrating a first cross-sectional structure of FIG. 1 along a1-a2. FIG. 3 is a schematic diagram illustrating a second cross-sectional structure of FIG. 1 along a1-a2. FIG. 4 is a schematic diagram illustrating a cross-sectional structure of FIG. 1 along b1-b2.

Referring to FIG. 1 and FIG. 2, according to some embodiments of the present disclosure, a solar cell is provided in an aspect of the embodiments of the present disclosure. The solar cell includes a substrate 100. The substrate 100 has a first surface 11. The first surface 11 includes an edge region 111 and a center region 112. The edge region 111 surrounds the center region 112. The edge region 111 is flush with or lower than the center region 112.

In some embodiments, the substrate 100 may be made of an element semiconductor material. Specifically, the element semiconductor material is composed of single elements, which may be silicon or germanium, for example. The element semiconductor material may be in a monocrystalline state, a polycrystalline state, an amorphous state, or a microcrystalline state (a state having both a monocrystalline state and an amorphous state is referred to as a microcrystalline state). For example, silicon may be at least one of monocrystalline silicon, polycrystalline silicon, amorphous silicon, or microcrystalline silicon.

In some embodiments, the substrate 100 may also be made of a compound semiconductor material. Common compound semiconductor materials include, but are not limited to, silicon germanide, silicon carbide, gallium arsenide, indium gallide, perovskite, cadmium telluride, copper indium diselenide, and other materials. The substrate 100 may also be a sapphire substrate, a silicon-on-insulator substrate, or a germanium-on-insulator substrate.

In some embodiments, the substrate 100 may be an N-type semiconductor substrate or a P-type semiconductor substrate. The N-type semiconductor substrate is doped with an N-type doped element. The N-type doped element may be any one of Group V elements such as phosphorus (P), bismuth (Bi), antimony (Sb), or arsenic (As). The P-type semiconductor substrate is doped with a P-type element. The P-type doped element may be any one of Group III elements such as boron (B), aluminum (Al), gallium (Ga), or indium (In).

In some embodiments, the substrate 100 further includes a second surface 12 opposite to the first surface 11.

In some embodiments, the solar cell is a single-sided cell. The second surface 12 may serve as a light receiving surface for receiving incident light, and the first surface 11 serves as a backlight surface. The first surface may serve as a light receiving surface, and the second surface may serve as a backlight surface. The backlight surface may also receive incident light, but the efficiency of receiving incident light by the backlight surface is weaker than the efficiency of receiving incident light by the light receiving surface. In the embodiments of the present disclosure, the first surface serves as a backlight surface and the second surface serves as a light receiving surface, for example.

In some embodiments, the solar cell is a double-sided cell. That is, both the first surface and the second surface of the substrate may serve as light receiving surfaces for receiving incident light.

In some embodiments, the first surface 11 of the substrate 100 is a polished surface. The polished surface refers to a flat surface formed by removing an original textured structure of the surface by a polishing solution or laser etching. The flatness of the polished first surface is increased, increasing the reflection of long-wave light, promoting the secondary absorption of projected light, and thus improving the short-circuit current. At the same time, due to the decrease of a specific surface area of the first surface, the recombination of the first surface is reduced, and the passivation effect of the first surface can be improved.

In some embodiments, the second surface 12 of the substrate 100 has a third textured structure 13. The third textured structure 13 may include a regularly shaped pyramid textured structure and irregularly shaped black silicon. An inclined surface of the third textured structure can increase the internal reflection of the incident light, thus improving the absorption and utilization rate of the substrate 100 for the incident light, and improving the cell efficiency of the solar cell.

In some embodiments, the third textured structure 13 includes a plurality of raised structures 131. A shape of a single raised structure 131 may include a pyramid shape, a parabola shape, or an elliptical sphere shape.

In some embodiments, the distribution of various film structures of the solar cell is illustrated by the edge region 111 and the center region 112 based on functional partitioning of the substrate 100. Referring to FIG. 1, a region surrounded by dotted lines in the figure is the center region, and a region surrounded by the dotted line region and an edge region of the substrate is the edge region.

A junction of an edge and another edge of the substrate is chamfered, and a region corresponding to the chamfered junction in the center region is also chamfered, so that the width of the edge region is basically the same, so as to improve the problem of edge leakage of the solar cell.

In some embodiments, referring to FIG. 1 and FIG. 2, the substrate 100 has a first boundary 121. A boundary of the center region 112 facing the edge region 111 is a second boundary 122. The first boundary 121 is opposite to the second boundary 122. A distance s between the second boundary 122 and the first boundary 121 is less than 300 µm. The distance s between the first boundary 121 and the second boundary 122 may be less than 280 µm, 268 µm, 235 µm, or 200 µm. The distance s between the first boundary 121 and the second boundary 122 may define the width of the edge region 111. The width of the edge region 111 is relatively small. That is, a region to be adjusted is relatively small, and the influence on the original process is correspondingly reduced, thus optimizing the cell performance at the edge and ensuring the cell performance of the center region 112.

In some embodiments, a height difference h between the edge region 111 and the center region 112 is in a range of 1.5 µm to 15 µm. For example, h may be in a range of 1.5 µm to 3 µm, 3 µm to 4.5 µm, 4.5 µm to 7 µm, 7 µm to 10 µm, or 10 µm to 15 µm. If the height difference h between the edge region 111 and the center region 112 is within the above range, there may be an obvious distinction between the edge region 111 and the center region 112, so that it can be ensured that the doped semiconductor layer located in the edge region 111 is removed as much as possible, and the edge region 111 is fully passivated by the passivation layer. The height difference h between the edge region 111 and the center region 112 can also improve the problem of leakage current in the edge region and the problem of edge breakage, thus improving the yield and aesthetics of the cell.

In some embodiments, referring to FIG. 3, the edge region 111 has a textured structure 14. The textured structure 14 may increase the internal reflectivity of incident light in the edge region 111 or improve the passivation effect of the passivation layer 114, thus improving the photoelectric conversion efficiency of the solar cell.

In some embodiments, the textured structure 14 includes a tower base structure, a pyramid structure, or a platform raised structure. The tower base structure refers to a truncated pyramid structure with a height lower than ¼ times a height of the original pyramid structure. The platform raised structure refers to a truncated pyramid structure with a height higher than ¼ times a height of the original pyramid structure.

In some embodiments, the tower base structure may also refer to a polished surface structure. The tower base structure may promote the flatness of the edge region 111 to be increased, increasing the reflection of long-wave light, promoting the secondary absorption of projected light, and thus improving the short-circuit current. At the same time, due to the decrease of a specific surface area of the edge region 111, the recombination in the edge region 111 is reduced, and the passivation effect in the edge region 111 can be improved.

In some embodiments, a height difference h1 between the top of the textured structure 14 and the center region 112 is in a range of 1 μm to 14 μm. h1 may be in a range of 1.5 μm to 3.2 μm, 3.2 μm to 5 μm, 5 μm to 7.5 μm, 7.5 μm to 11 μm, or 11 μm to 14 μm.

In some embodiments, referring to FIG. 3, the textured structure 14 is a pyramid structure. The pyramid structure includes a plurality of pyramids 141. A one-dimensional size d2 of each pyramid 141 is in a range of 0.1 μm to 3 μm. A height d1 of each pyramid 141 is in a range of 0.1 μm to 3 μm.

In some embodiments, the one-dimensional size refers to a distance between two diagonal corners of a bottom of the pyramid 141 or a distance between two opposite sides of a bottom of the pyramid 141.

In some embodiments, referring to FIG. 3, the height difference h between the edge region 111 and the center region 112 may refer to a height difference between the top of the pyramid 141 and the center region 112.

In some embodiments, the height difference h between the edge region 111 and the center region 112 refers to a height difference between the bottom of the pyramid and the center region 112. A height difference between a top of the pyramid and the center region is in a range of 1 μm to 14 μm.

With continued reference to FIG. 2, the solar cell includes a dielectric layer 102 and a doped semiconductor layer 103. The dielectric layer 102 is formed over the center region 112. The doped semiconductor layer 103 is formed over the dielectric layer 102.

In some embodiments, the dielectric layer 102 may be a tunneling dielectric layer. The tunneling dielectric layer and the doped semiconductor layer 103 form a passivation contact structure. The doped semiconductor layer 103 can form bending of an energy band on a surface of the substrate 100. The tunneling dielectric layer causes an asymmetric shift in the energy band on the surface of the substrate 100, so that a barrier for majority carriers in carriers is lower than a barrier for minority carriers in the carries. Therefore, the majority carriers can easily perform quantum tunneling through the tunneling dielectric layer, while it is difficult for the minority carriers to pass through the tunneling dielectric layer, so as to achieve selective carrier transmission.

Furthermore, the tunneling dielectric layer has the effect of chemical passivation. Specifically, due to the existence of interface state defects at the interface between the substrate 100 and the tunneling dielectric layer, the interface state density of the first surface of the substrate 100 is large. The increase of the interface state density will promote the recombination of photo-generated carriers and increase the filling factor, short-circuit current, and open-circuit voltage of the solar cell, so as to improve the photoelectric conversion efficiency of the solar cell. The tunneling dielectric layer is arranged on the first surface of the substrate 100, so that the tunneling dielectric layer has a chemical passivation effect on the surface of the substrate 100, which is specifically that: by saturating dangling bonds of the substrate 100, reducing the defect state density of the substrate 100, and reducing the recombination center of the substrate 100 to decrease the carrier recombination rate.

The doped semiconductor layer 103 has a field passivation effect. Specifically, an electrostatic field directed to the inside of the substrate 100 is formed on the surface of the substrate 100, so that the minority carriers escape from the interface, the concentration of the minority carriers is reduced, and the carrier recombination rate at the interface of the substrate 100 is reduced, thus increasing the filling factor, short-circuit current, and open-circuit voltage of the solar cell, and improving the photoelectric conversion efficiency of the solar cell.

The doped semiconductor layer 103 may be doped with a doped element of the same type as that of the substrate 100. For example, if the substrate 100 has an N-type doped element, the doped semiconductor layer 103 is doped with an N-type doped element.

A concentration of the doped element in the doped semiconductor layer 103 is greater than a concentration of the doped element of the substrate 100 to form a sufficiently high barrier on the surface of the substrate 100, so that the majority carriers in the substrate 100 can pass through the tunneling dielectric layer into the doped semiconductor layer 103.

In some embodiments, the doped semiconductor layer 103 may be doped with a doped element of a conductive type different from that of the substrate 100. For example, if the substrate 100 has a P-type doped element, the doped semiconductor layer 103 may have an N-type doped element. In this way, a PN junction is constructed between the doped semiconductor layer 103 and the substrate 100. A new hole-electron pair is formed by the sun irradiating the PN junction. Under the action of an electric field built in the P-N junction, photo-generated holes flow to the p-region, and photo-generated electrons flow to the n-region. Current is generated after the circuit is turned on.

In some embodiments, the tunneling dielectric layer has a thickness of 0.5 nm to 5 nm. The thickness of the tunneling dielectric layer is in a range of 0.5 nm to 1.3 nm, 1.3 nm to 2.6 nm, 2.6 nm to 4.1 nm, or 4.1 nm to 5 nm. If the thickness of the tunneling dielectric layer is in any of the above ranges, the thickness of the tunneling dielectric layer is small. The majority carriers can easily perform quantum tunneling through the tunneling dielectric layer, while it is difficult for the minority carriers to pass through the tunneling dielectric layer, so as to achieve selective carrier transmission.

In some embodiments, the dielectric layer 102 is made of at least one of silicon oxide, amorphous silicon, microcrystalline silicon, nanocrystalline silicon, or silicon carbide.

In some embodiments, the doped semiconductor layer 103 includes at least one of a doped amorphous silicon layer, a doped polycrystalline silicon layer, a doped microcrystalline silicon layer, a doped silicon carbide layer, or a doped crystalline silicon layer.

With continued reference to FIG. 2, the solar cell includes a passivation layer 114 and electrodes 116. The passivation layer 114 covers the edge region 111 and a surface of the doped semiconductor layer 103 facing away from the dielectric layer 102. The electrodes 116 include a first plurality of electrodes that are located in the center region 112 and penetrate the passivation layer 114 in a thickness direction to be in electrical contact with the doped semiconductor layer 103.

In some embodiments, the passivation layer 114 may be a single-layer structure or a layered structure. The passivation layer 114 may be made of one or more of silicon oxide, silicon nitride, silicon oxynitride, silicon carbonitride, titanium oxide, hafnium oxide, or aluminum oxide.

In some embodiments, referring to FIG. 3, the passivation layer 114 covers the textured structure 14.

In some embodiments, the solar cell further includes an anti-reflection layer 105. The anti-reflection layer 105 is formed over the passivation layer 114. The electrodes 116 include a first plurality of electrodes that penetrate the anti-reflection layer 105 in a thickness direction to be in electrical contact with the doped semiconductor layer 103. The anti-reflection layer 105 is configured to reduce or eliminate reflected light on the surface of the solar cell, thus increasing the light transmittance of the surface of the solar cell, and reducing or eliminating stray light of the system. The anti-reflection layer 105 is made of silicon nitride or silicon oxynitride.

In some embodiments, the solar cell further includes an emitter 101, a first passivation layer 104, and finger electrodes 106. The emitter 101 is located on the second surface 12. The first passivation layer 104 covers a surface of the emitter 101 facing away from the substrate 100. The finger electrodes 106 penetrate the first passivation layer 104 to be in electrical contact with the emitter 101.

In some embodiments, the emitter 101 and the substrate 100 are made of the same material, and the emitter 101 and the substrate 100 may be formed by the same original substrate subjected to doping processing. A type of a doped element in the emitter 101 is different from a type of a doped element in the substrate 100. A part, with a certain thickness, of the original substrate is subjected to doping processing. The part of the original substrate subjected to doping processing serves as the emitter, and the remaining part of the original substrate serves as the substrate.

In some embodiments, the emitter 101 is a semiconductor layer which is doped with N-type doped elements or P-type doped elements and formed by a deposition process of a doped layer formed on the second surface of the substrate. The semiconductor layer may be silicon, germanium, or polycrystalline silicon.

In some embodiments, the first passivation layer 104 may be a single-layer structure or a layered structure. The first passivation layer 104 may be made of one or more of silicon oxide, silicon nitride, silicon oxynitride, silicon carbonitride, titanium oxide, hafnium oxide, or aluminum oxide.

In some embodiments, the first passivation layer 104 and the passivation layer 114 are made of the same material. The first passivation layer 104 and the passivation layer 114 are prepared in the same preparation process.

In some embodiments, either of the electrodes 116 and the finger electrodes 106 may be sintered from a burn-through paste. The method for forming the electrodes 116 includes: printing a metal paste on a surface of a part of the passivation layer 114 by using a screen printing process. The method for forming the finger electrodes 106 includes: printing a metal paste on a surface of a part of the first passivation layer 104 by using a screen printing process. The metal paste may include at least one of silver, aluminum, copper, tin, gold, lead, or nickel.

In some embodiments, with reference to FIG. 2 or FIG. 4, the electrodes 116 and the finger electrodes 106 are formed in the center region 112.

Figure 5:
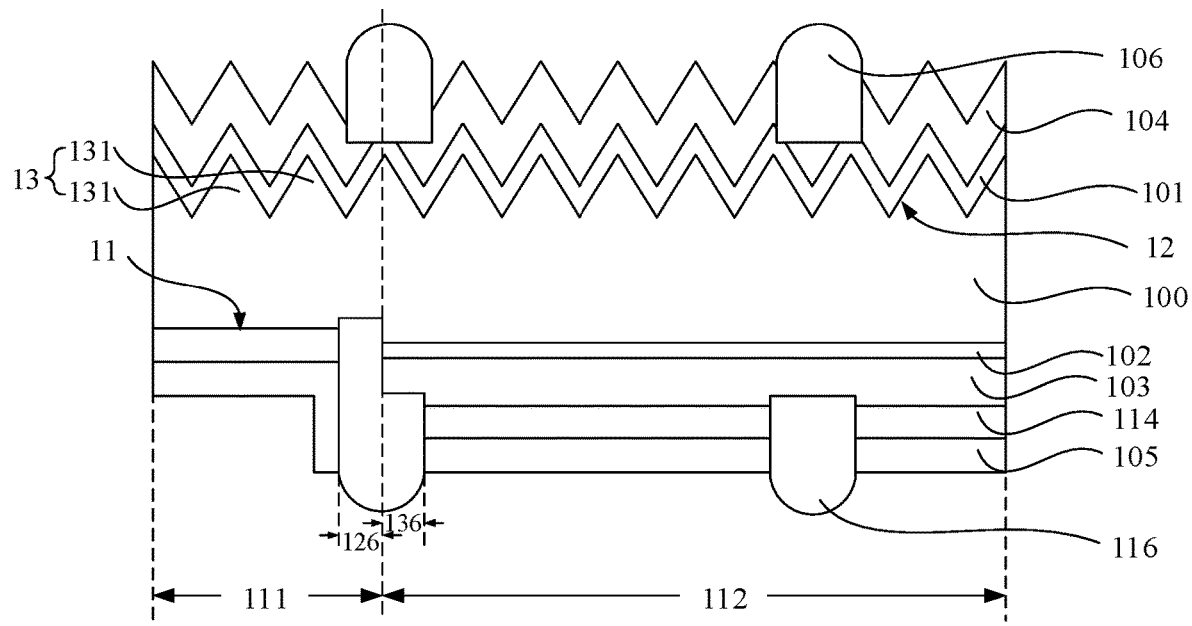
FIG. 5 is a schematic diagram illustrating a cross-sectional structure of a solar cell in accordance with an embodiment of the present disclosure.
Figure 6:
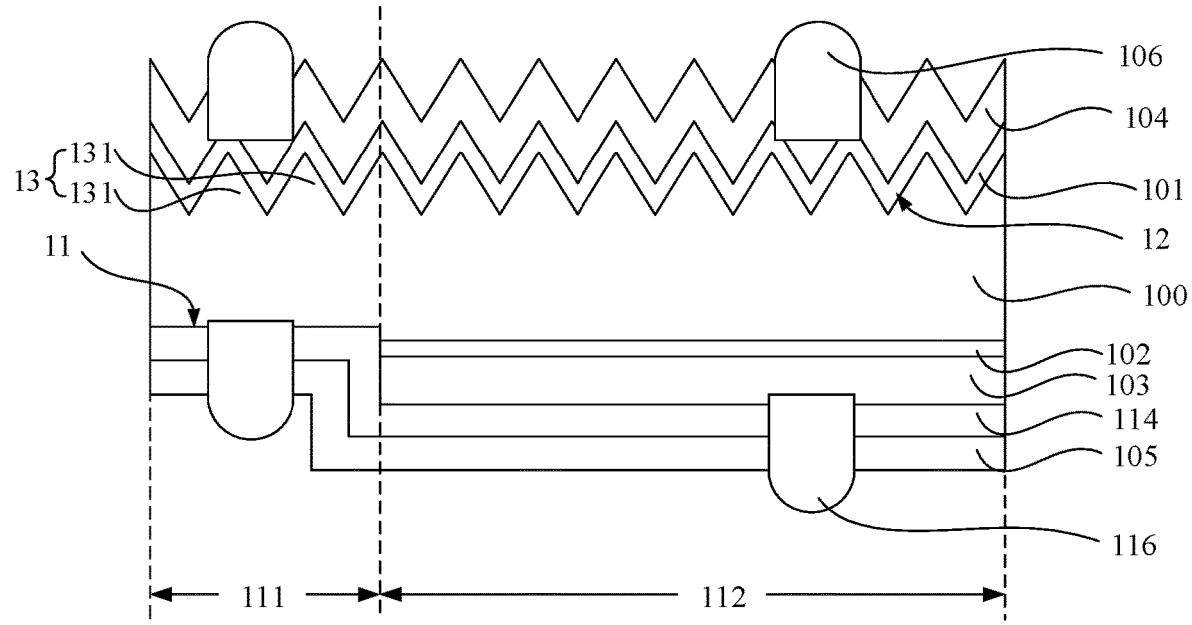
FIG. 6 is a schematic diagram illustrating another cross-sectional structure of a solar cell in accordance with an embodiment of the present disclosure.
Figure 7:
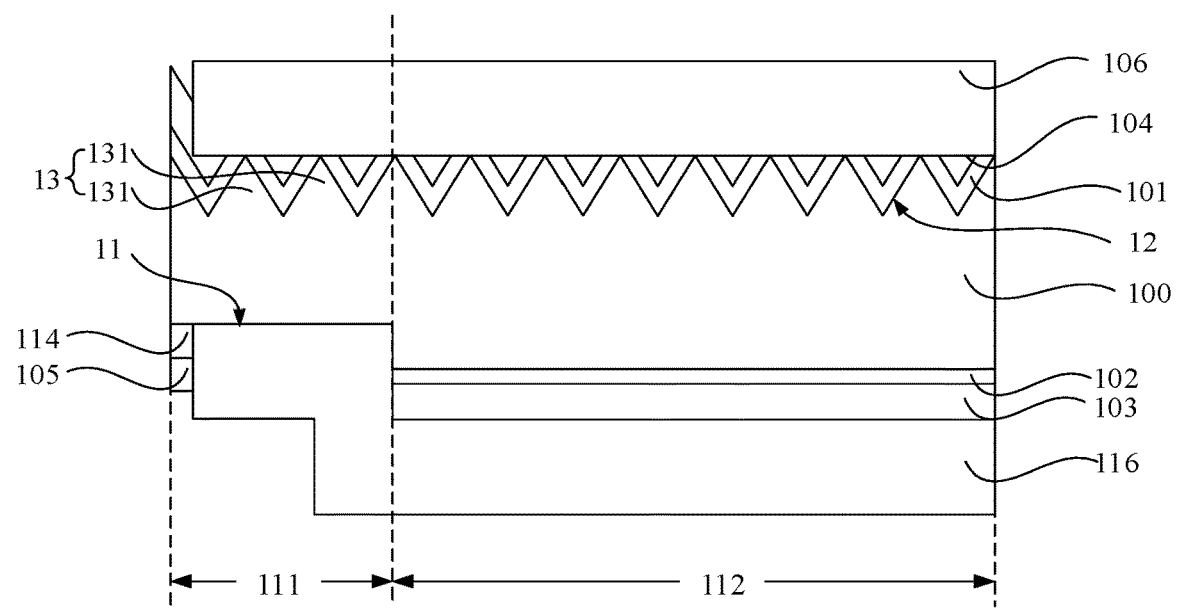
FIG. 7 is a schematic diagram illustrating still another cross-sectional structure of a solar cell in accordance with an embodiment of the present disclosure.

FIG. 5 is a schematic diagram illustrating a cross-sectional structure of a solar cell in accordance with an embodiment of the present disclosure. FIG. 6 is a schematic diagram illustrating another cross-sectional structure of a solar cell in accordance with an embodiment of the present disclosure. FIG. 7 is a schematic diagram illustrating still another cross-sectional structure of a solar cell in accordance with an embodiment of the present disclosure.

In some embodiments, referring to FIG. 5 and FIG. 7, the electrodes 116 further include a third plurality of electrodes, and each of the third plurality of electrodes includes a first portion 136 and a second portion 126 arranged along a first direction. The first portion 136 is formed over the center region 112. The second portion 126 is formed over the edge region 111. The first direction is an arrangement direction of the electrodes 116. In this way, the collection area of the electrodes 116 is increased, thus improving the cell efficiency.

In some embodiments, the first portion 136 is in electrical contact with the doped semiconductor layer 103, and the second portion 126 is in electrical contact with the substrate 100.

In some embodiments, referring to FIG. 6, the electrodes 116 further includes second plurality of electrodes that are formed in the edge region 111 and penetrate the passivation layer 114 in a thickness direction to be in electrical contact with the edge region 111.

Embodiments of the present disclosure provide a solar cell. A substrate 100 is divided into an edge region 111 and a center region 112, and then film layers in the edge region 111 and the center region 112 are designed differently, thus avoiding the problem of over-etching of the edge region 111 and ensuring larger electrical performance of the center region 112. The edge region 111 is flush with or lower than the center region 112, and a passivation layer 114 covers the edge region 111 and a surface of a doped semiconductor layer 103, so that the surface defects and flatness at an edge can be reduced, and the edge of a cell can be fully and effectively passivated. In this way, the electrical recombination and leakage at the edge of the cell can be reduced, and the open circuit voltage and short circuit current of the cell can be improved, thus improving the photoelectric conversion efficiency of the cell.

Accordingly, another embodiment of the present disclosure provides a solar cell. The solar cell includes first electrodes and second electrodes. The first electrodes and the second electrodes are all formed over the first surface. Technical features the same as or corresponding to those in the foregoing embodiments are not be described in detail herein.

Figure 8:
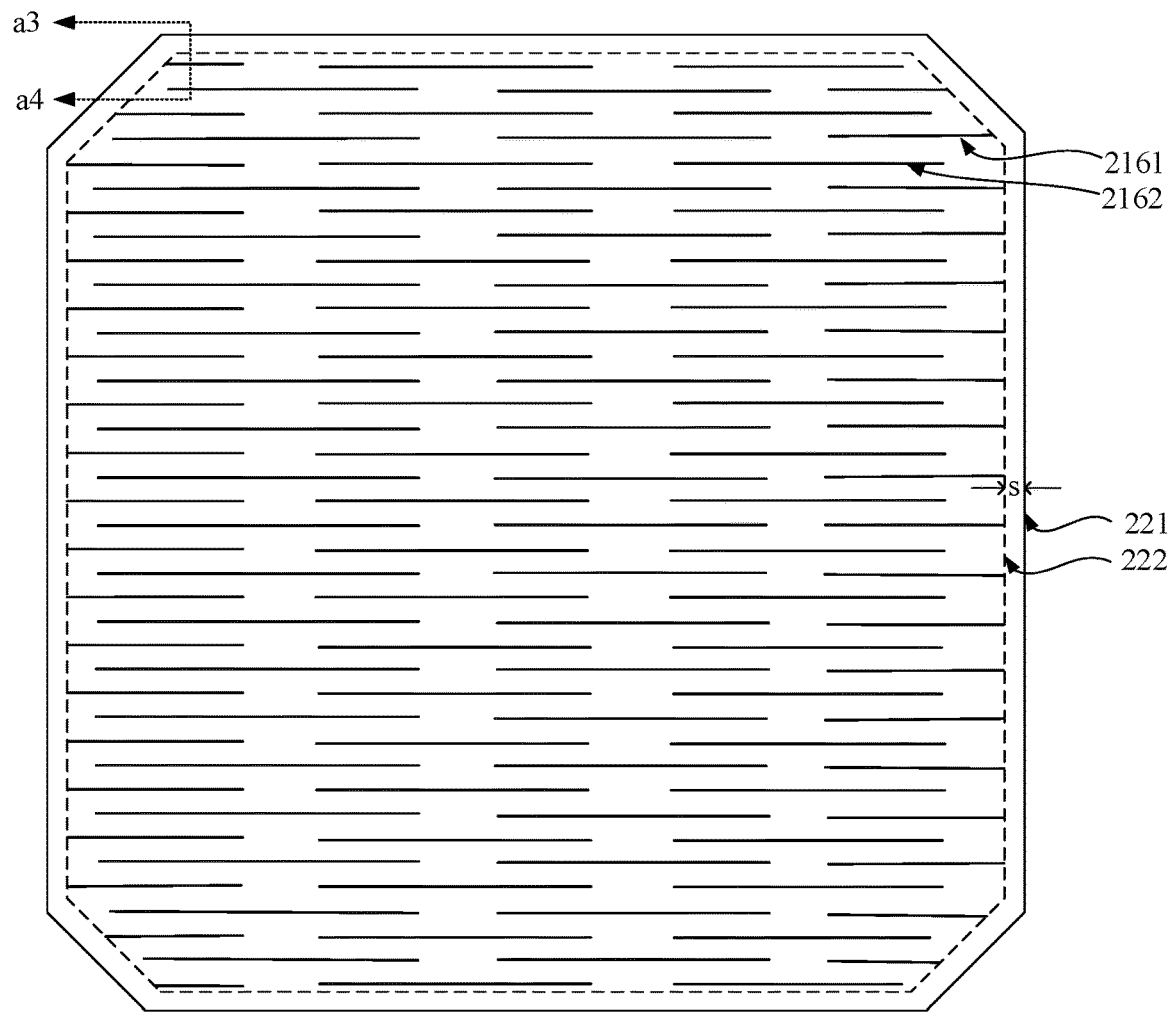
FIG. 8 is a schematic diagram illustrating a structure of a solar cell in accordance with another embodiment of the present disclosure.
Figure 9:
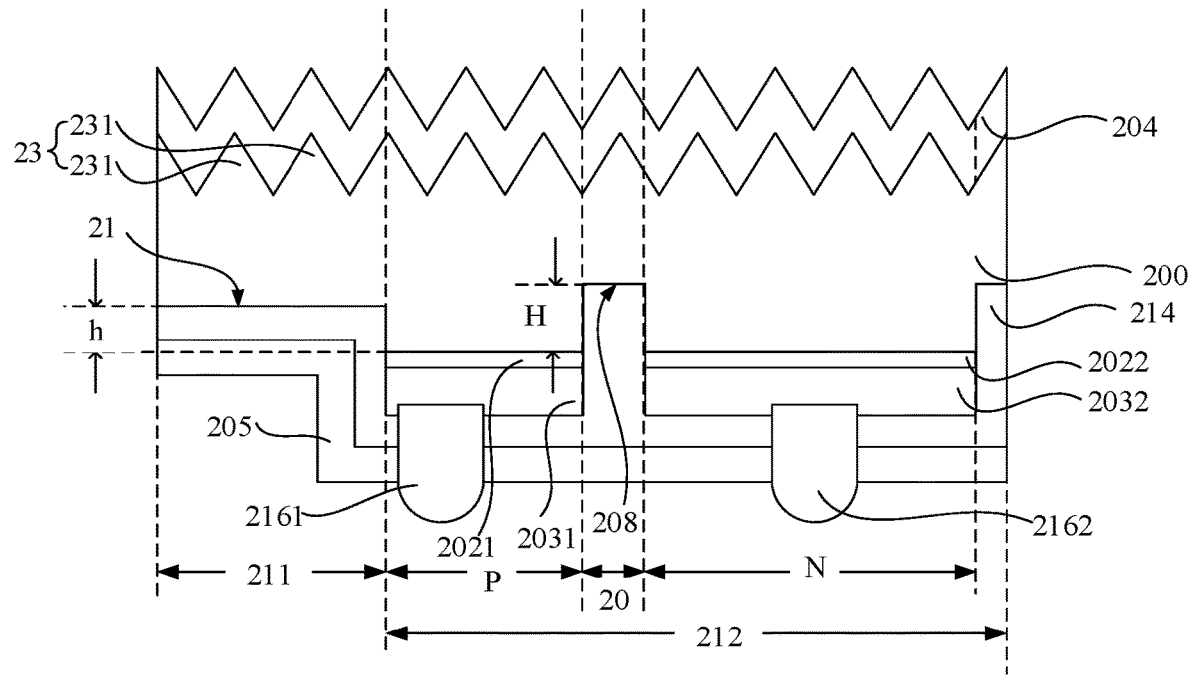
FIG. 9 is a schematic diagram illustrating a first cross-sectional structure of FIG. 8 along a3-a4.
Figure 10:
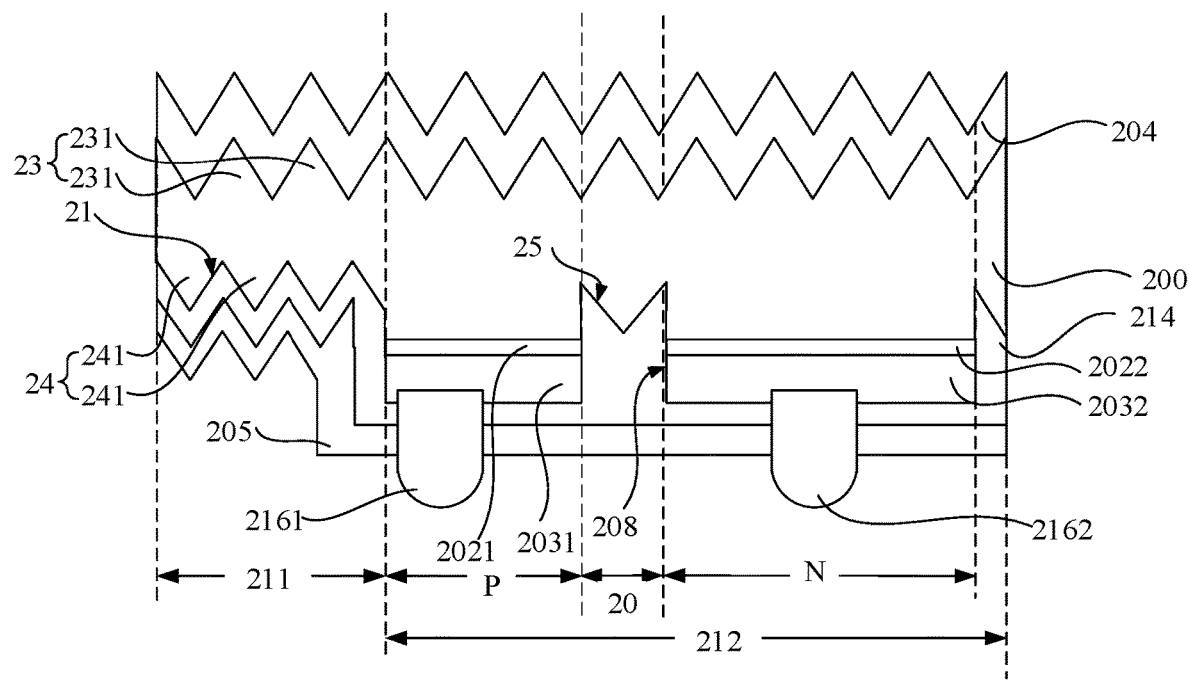
FIG. 10 is a schematic diagram illustrating a second cross-sectional structure of FIG. 8 along a3-a4.

FIG. 8 is a schematic diagram illustrating a structure of a solar cell in accordance with another embodiment of the present disclosure. FIG. 9 is a schematic diagram illustrating a first cross-sectional structure of FIG. 8 along a3-a4. FIG. 10 is a schematic diagram illustrating a second cross-sectional structure of FIG. 8 along a3-a4.

Referring to FIG. 8 and FIG. 9, the solar cell includes a substrate 200, a dielectric layer, a doped semiconductor layer, a passivation layer 214, and electrodes. The substrate 200 has a first surface 21. The first surface 21 includes an edge region 211 and a center region 212. The edge region 211 surrounds the center region 212. The edge region 211 is flush with or lower than the center region 212. The dielectric layer is formed over the center region 212. The doped semiconductor layer is formed over the dielectric layer. The passivation layer 214 covers the edge region 211 and a surface of the doped semiconductor layer facing away from the dielectric layer. The electrodes are located in the center region 212, and penetrate the passivation layer 214 in a thickness direction to be in electrical contact with the doped semiconductor layer.

In some embodiments, the substrate 200 includes a first surface 21 and a second surface 22 opposite to each other. The second surface 22 has a third textured structure 23. The third textured structure 23 includes a plurality of raised structures 231. The second surface 22 has a front surface field (FSF), and has doped ions of a conductive type the same as that of the substrate 200. A concentration of minority carriers on the surface is reduced by using a field passivation effect, thus reducing the recombination rate of the surface, reducing the series resistance, and improving the electron transport capability.

In some embodiments, the center region 212 includes P-regions and N-regions arranged alternatingly, and spacer regions 20. Each respective spacer region 20 of the spacer regions 20 is provided between a respective P-region of the P-regions and a respective N-region of the N-regions.

In some embodiments, the spacer region 20 is flush with the P-region and the N-region. That is, the substrate is not etched, and the P-region and the N-region are insulated from each other by some isolating film layers, which may be passivation layers.

In some embodiments, referring to FIG. 9, the spacer region 20 is lower than the P-region and the spacer region 20 is lower than the N-region. The spacer region 20 has a trench 208. The trench 208 extends from the first surface 21 to the second surface 22. The trench 208 is configured to achieve automatic isolation between regions of different conductive types, so that the influence on the cell efficiency, brought by the leakage due to a tunnel junction formed by the heavily doped P-region and N-region in an interdigitated back contact (IBC) cell, can be eliminated.

In some embodiments, a depth H of the trench 208 is greater than or equal to a height difference h between the edge region 211 and the center region 212.

The height difference h between the edge region 211 and the center region 212 refers to a height difference between the edge region 211 and the P-region or a height difference between the edge region 211 and the N-region.

In some embodiments, referring to FIG. 10, the edge region 211 has a first textured structure 24. The spacer region 20 has a second textured structure 25. The first textured structure 24 has a roughness greater than or equal to that of the second textured structure 25.

"Roughness" refers to an arithmetic mean of absolute values of vertical deviations of peaks and troughs within a sampling length relative to a mean horizontal line which is set in the sampling length. The roughness may be measured by a comparison method, a light cutting method, an interference method, and a needle tracing method.

In some embodiments, the doped semiconductor layer includes a first doped semiconductor layer 2031 in the P-regions and a second doped semiconductor layer 2032 in the N-regions. The electrodes include first electrodes 2161 and second electrodes 2162. The first electrodes 2161 are in electrical contact with the first doped semiconductor layer 2031. The second electrodes 2162 are in electrical contact with the second doped semiconductor layer 2032. The passivation layer 214 further covers a surface of the substrate 200 in spacer regions 20.

In some embodiments, the dielectric layer includes a first dielectric layer 2021 and a second dielectric layer 2022. The first doped semiconductor layer 2031 is located on the first dielectric layer 2021. The second doped semiconductor layer 2032 is located on the second dielectric layer 2022.

In some embodiments, the first dielectric layer 2021 and the second dielectric layer 2022 may be the same as the dielectric layer 102 in the previous embodiment. That is, the first dielectric layer 2021 and the second dielectric layer 2022 are tunneling dielectric layers. Similarly, the first doped semiconductor layer 2031 and the second doped semiconductor layer 2032 may be the doped semiconductor layer 103 in the previous embodiment, except that the first doped semiconductor layer 2031 is doped with one of an N-type doped element and a P-type doped element, and the second doped semiconductor layer 2032 is doped with the other of the N-type doped element and the P-type doped element.

In some embodiments, the first electrodes 2161 and the second electrodes 2162 may be referenced to the electrodes 116 in the previous embodiment. The first passivation layer 204 of the second surface 22 may be referenced to the first passivation layer 104 in the previous embodiment. The anti-reflection layer 205 may be referenced to the anti-reflection layer 105 in the previous embodiment. The passivation layer 214 may be referenced to the passivation layer 114 of the previous embodiment. Details are not described herein again.

Embodiments of the present disclosure provide a solar cell. A substrate 200 is divided into an edge region 211 and a center region 212, and then, film layers in the edge region 211 and the center region 212 are designed differently, thus avoiding the problem of over-etching of the edge region 211 and ensuring larger electrical performance of the center region 212. The edge region 211 is flush with or lower than the center region 212, and a passivation layer 214 covers the edge region 211 and a surface of a doped semiconductor layer, so that the surface defects and flatness at an edge can be reduced, and the edge of a cell can be fully and effectively passivated. In this way, the electrical recombination and leakage at the edge of the cell can be reduced, and the open circuit voltage and short circuit current of the cell can be improved, thus improving the photoelectric conversion efficiency of the cell.

Accordingly, according to some embodiments of the present disclosure, a method for preparing a solar cell is also provided in another aspect of the embodiments of the present disclosure. The method is configured to prepare the solar cell provided in the foregoing embodiments. Technical features the same as or corresponding to the foregoing embodiments are not be described in detail herein again.

FIGS. 11 to 18 are schematic diagrams illustrating cross-sectional structures of a solar cell corresponding to operations in a method for preparing a solar cell in accordance with still another embodiment of the present disclosure. In the embodiments of the present disclosure, the solar cell provided in another embodiment is taken as an example.

Figure 11:
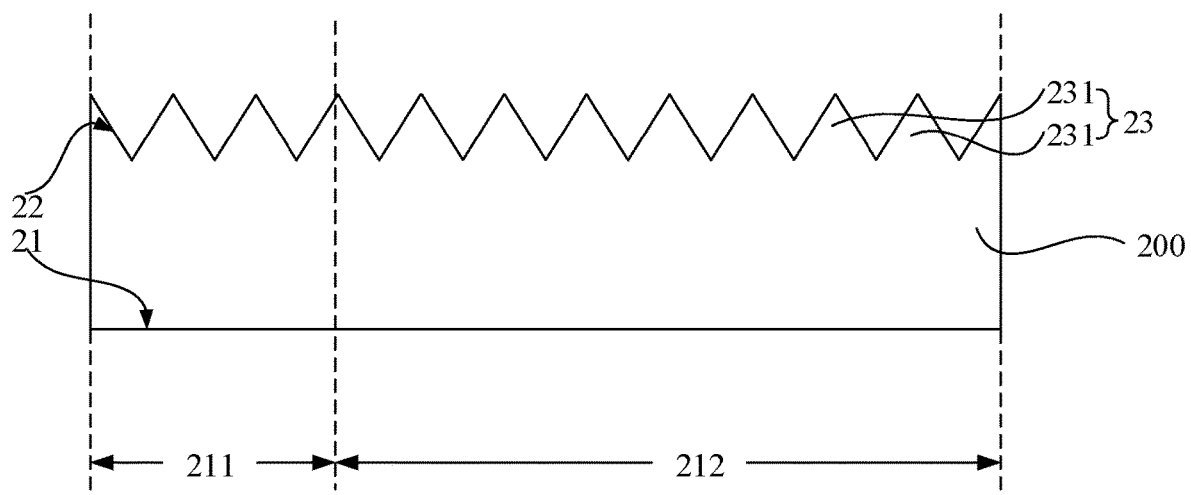
FIGS. 11 to 18 are schematic diagrams illustrating cross-sectional structures of a solar cell corresponding to operations in a method for preparing a solar cell in accordance with still another embodiment of the present disclosure.

Referring to FIG. 11, the method includes: providing a substrate 200. The substrate 200 has a first surface 21. The first surface 21 includes an edge region 211 and a center region 212. The edge region 211 surrounds the center region 212.

In some embodiments, the substrate 200 has a second surface 22 opposite to the first surface 21.

The method includes: subjecting the second surface 22 to texturing processing, so that the second surface 22 has a third textured structure 23. The third textured structure 23 includes a plurality of raised structures 231.

In some embodiments, the texturing processing includes chemical etching, such as cleaning the substrate 200 with a mixed solution of potassium hydroxide and hydrogen peroxide, which may be specifically that: a concentration ratio of potassium hydroxide to hydrogen peroxide is controlled to form a textured structure with a desired morphology. In some embodiments, the textured structure may also be formed by laser etching, mechanical etching, plasma etching, or the like. In the laser etching, laser process parameters are controlled to obtain a desired textured structure.

Figure 12:
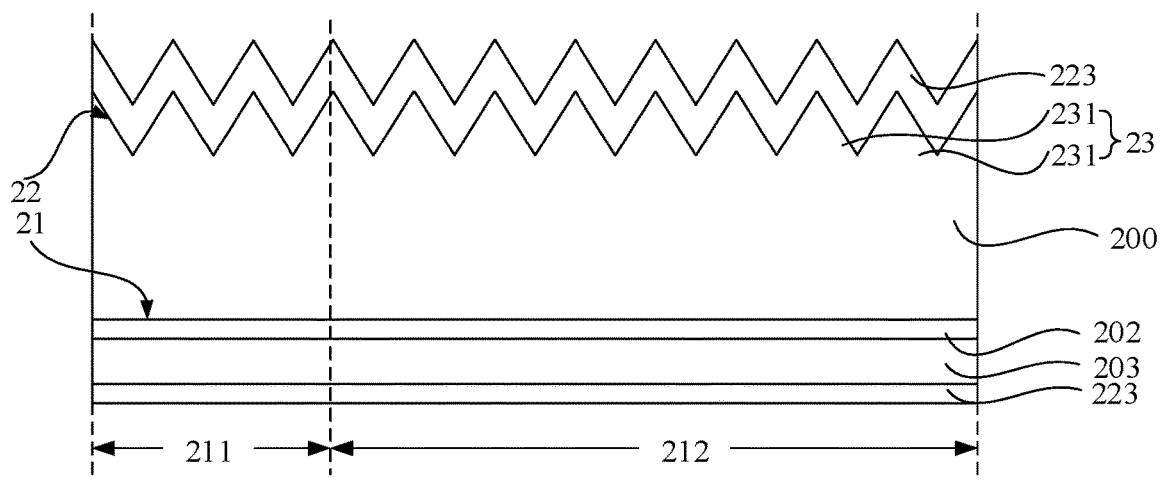

Referring to FIG. 12, the method includes: forming a dielectric layer 202 over the center region 212 and the edge region 211; and forming a doped semiconductor layer 203 over the dielectric layer 202, and forming a doped silicon glass layer 223 over the second surface 22 of the substrate 200 and a surface of the doped semiconductor layer 203 facing away from the dielectric layer 202 while the doped semiconductor layer 203 is formed.

In some embodiments, the dielectric layer 202 is formed by thermal oxygen or chemical deposition.

In some embodiments, the method for forming the doped semiconductor layer 203 includes: first deposition, where deposition gas includes silane, a flow rate is controlled to be 100 sccm to 1000 sccm, and a deposition temperature is controlled to be 400° C. to 700° C., to form an intrinsic semiconductor film; second deposition, where deposition gas includes doping source gas and oxygen, a flow rate is controlled to be 100 sccm to 3000 sccm, and a deposition temperature is controlled to be 700° C. to 1000° C., to form a doped semiconductor film; and high-temperature oxidation, where gas includes nitrogen and oxygen, the doped semiconductor film is converted into a doped semiconductor layer, and the doped silicon glass layer 223 is formed on each of the second surface 22 of the substrate 200 and the surface of the doped semiconductor layer 203.

Figure 13:
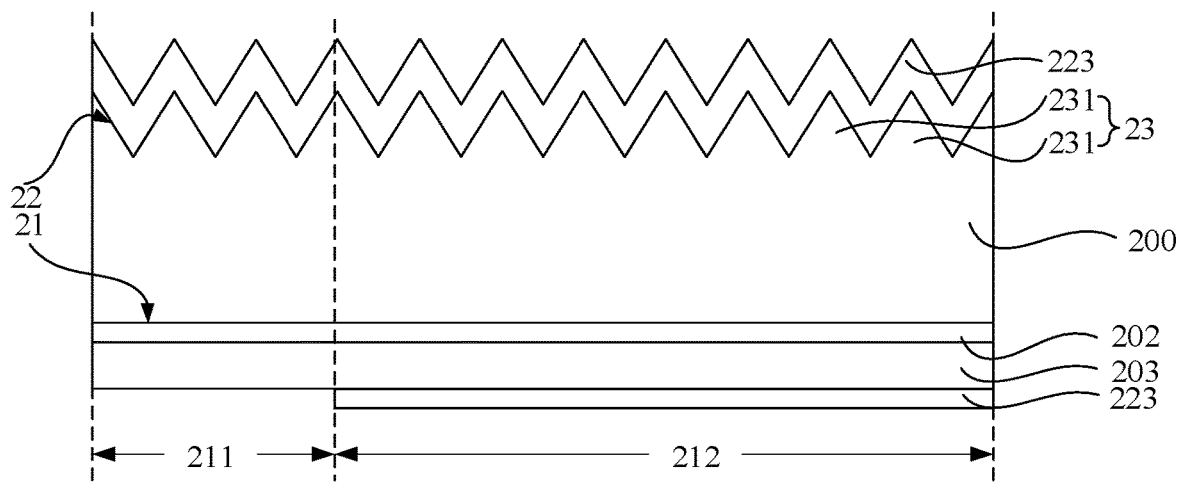

Referring to FIG. 13, the method includes: subjecting the doped silicon glass layer 223 to preprocessing to remove the doped silicon glass layer 223 over the edge region 211.

In some embodiments, the preprocessing includes laser processing. A picosecond laser and a nanosecond laser may be used for laser. Parameters of the laser processing include: a laser power of 8 W to 40 W and a speed of 10000 mm/s to 35000 mm/s.

Figure 14:
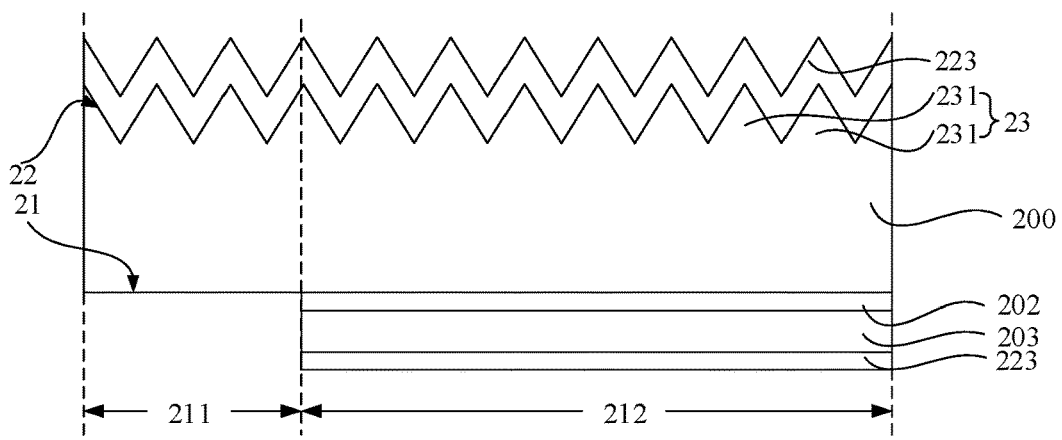
Figure 15:
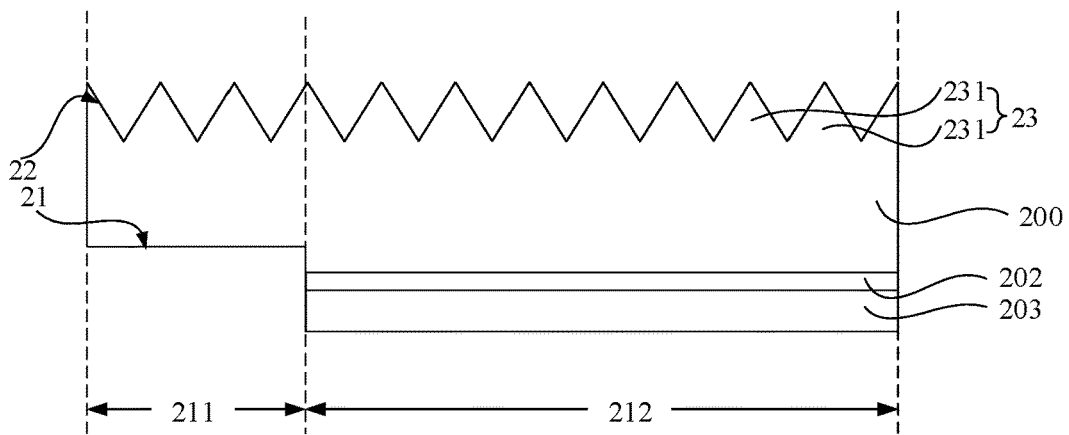

In some embodiments, referring to FIG. 14 and FIG. 15, process operations of the preprocessing include: removing the doped semiconductor layer 203 over the edge region 211 and the dielectric layer 202 over the edge region 211 while removing the doped silicon glass layer 223 over the edge region 211.

Referring to FIG. 15, the method includes: removing the doped silicon glass layer 223 over the second surface 22 and the doped silicon glass layer 223 over the center region 212.

In some embodiments, during the removal of the doped silicon glass layer 223, the doped semiconductor layer 203 and the dielectric layer 202 are etched by an etching solution, which may remove the doped semiconductor layer 203 and the dielectric layer 202.

In some embodiments, the center region 212 includes P-regions and N-regions arranged alternatingly, and spacer regions 20. Each respective spacer region of the spacer regions 20 is provided between a respective P-region of the P-regions and a respective N-region of the N-regions. The doped semiconductor layer 203 is formed over the P-regions, the N-regions, and the spacer regions 20.

Figure 16:
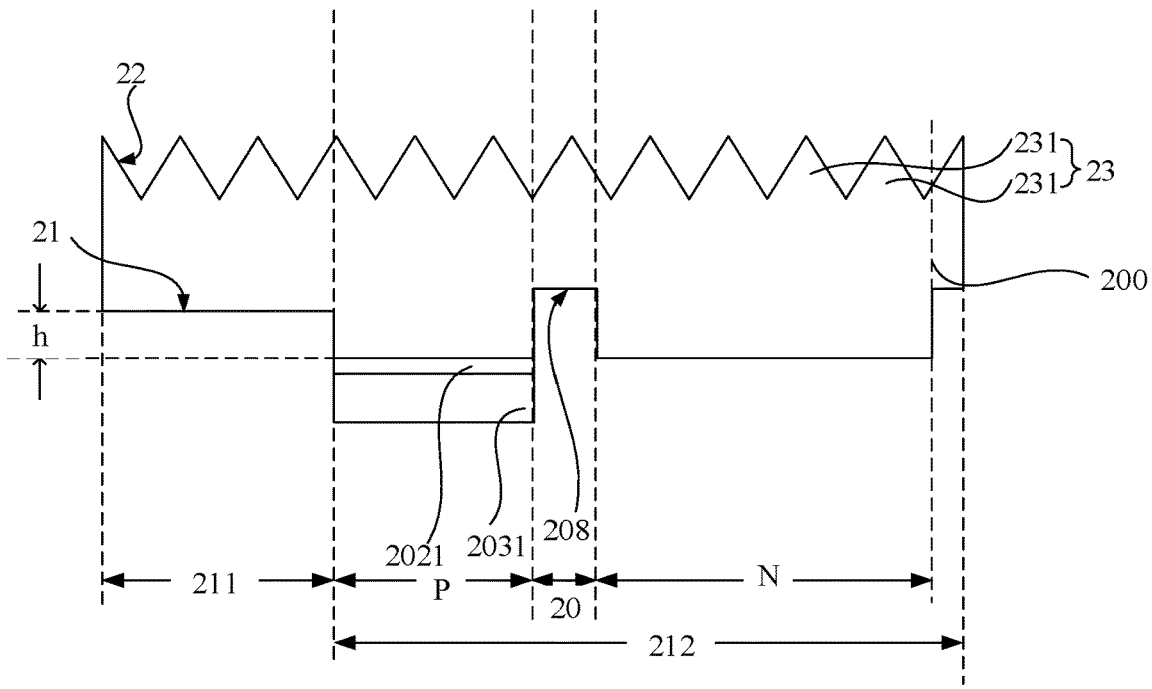

Referring to FIG. 16, the method includes: removing the doped semiconductor layer over the spacer regions 20 and first regions, where the first regions are one of the P-regions or the N-regions.

In some embodiments, the doped semiconductor layer and the dielectric layer over the spacer regions 20 are removed, and the substrate is not etched, with no trench generated in the substrate. In some embodiments, the doped semiconductor layer and the dielectric layer over the spacer regions 20 are removed, and a part, with a certain thickness, of the substrate is removed, namely, trenches are formed in the substrate.

Figure 18:
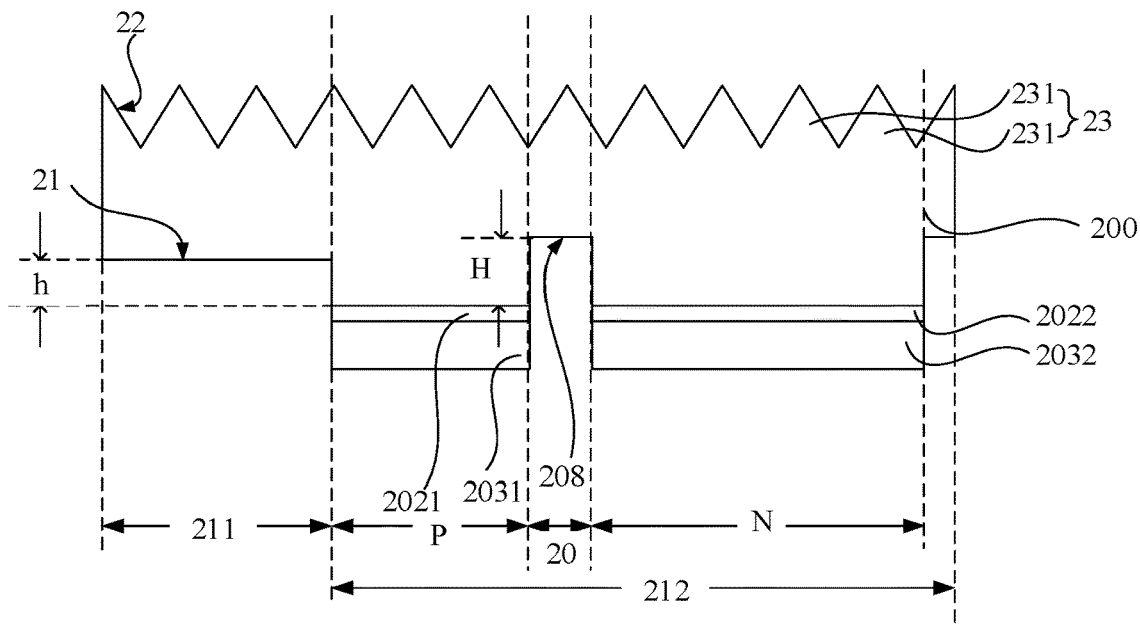

Referring to FIG. 18, the method includes: forming a doped semiconductor film over a surface of the substrate 200 in the first regions, where the remaining doped semiconductor layer and the doped semiconductor film serve as a first doped semiconductor layer 2031 and a second doped semiconductor layer 2032 respectively.

Figure 17:
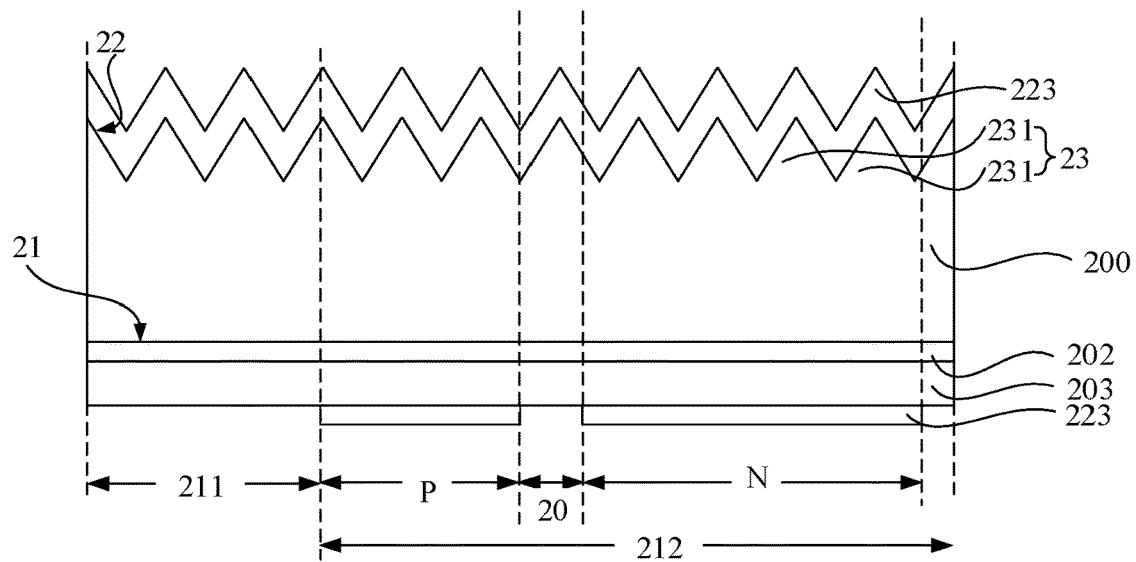

In some embodiments, referring to FIG. 17, process operations of the preprocessing include: removing the doped silicon glass layer 223 over the spacer regions 20 and the first regions while removing the doped silicon glass layer 223 over the edge region 211, where the first regions are one of the P-regions or the N-regions. Referring to FIG. 16, the doped silicon glass layer 223 over the second surface 22 and the doped silicon glass layer 223 over the center region 212 are removed, and the doped semiconductor layer over the spacer regions 20 and the first regions is removed, where the first regions are one of the P-regions or the N-regions. Referring to FIG. 18, after the doped silicon glass layer 223 over the second surface 22 and the doped silicon glass layer 223 over the center region 212 are removed, the method further includes: forming a doped semiconductor film over the first regions, where the remaining doped semiconductor layer and the doped semiconductor film serve as a first doped semiconductor layer 2031 and a second doped semiconductor layer 2032 respectively.

In some embodiments, the doped silicon glass layer 223 over the spacer regions 20, the edge region 211, and the first regions is removed by laser processing. A picosecond laser and a nanosecond laser may be used for laser. Parameters of the laser processing include: a laser power of 8 W to 40 W and a speed of 10000 mm/s to 35000 mm/s.

In some embodiments, the doped semiconductor layer and the dielectric layer over the spacer regions 20 are removed, and the substrate is not etched, with no trench generated in the substrate. In some embodiments, the doped semiconductor layer and the dielectric layer over the spacer regions 20 are removed, and a part, with a certain thickness, of the substrate is removed, namely, trenches are formed in the substrate.

Referring to FIG. 9, the method includes: forming a passivation layer 214, where the passivation layer 214 covers the edge region 211 and a surface of the doped semiconductor layer facing away from the dielectric layer. In some embodiments, the passivation layer 214 covers the edge region 211, the spacer regions 20, and surfaces of the first doped semiconductor layer 2031 and the second doped semiconductor layer 2032.

With continued reference to FIG. 9, the method includes: forming a first passivation layer 204, where the first passivation layer 204 covers the second surface 22 of the substrate 200.

In some embodiments, the passivation layer 214 and the first passivation layer 204 are formed in the same preparation process.

With continued reference to FIG. 9, the method includes: forming electrodes, including electrodes located in the center region 212 and penetrate the passivation layer 214 in a thickness direction to be in electrical contact with the doped semiconductor layer. The electrodes include first electrodes 2161 and second electrodes 2162. The first electrodes 2161 penetrate the passivation layer 214 in a thickness direction to be in electrical contact with the first doped semiconductor layer 2031. The second electrodes 2162 penetrate the passivation layer 214 in a thickness direction to be in electrical contact with the second doped semiconductor layer 2032.

In some embodiments, the method for preparing the first electrodes 2161 and the second electrodes 2162 includes: printing a metal paste on the surface of a part of the passivation layer 214 by using a screen printing process. The metal paste may include at least one of silver, aluminum, copper, tin, gold, lead, or nickel. Then, the metal paste is sintered, and the metal paste contains a material having a highly corrosive component such as glass powder. In this way, during the sintering process, the corrosive component will corrode the passivation layer 214, so that the metal paste penetrates into the passivation layer 214 to be in electrical contact with the first doped semiconductor layer 2031 to form the first electrode 2161, and to be in electrical contact with the second doped semiconductor layer 2032 to form the second electrode 2162.

Accordingly, according to some embodiments of the present disclosure, a photovoltaic module is also provided in still another aspect of the embodiments of the present disclosure. The photovoltaic module includes the solar cells provided in the foregoing embodiments. Technical features the same as or corresponding to the foregoing embodiments are not be described in detail herein.

Figure 19:
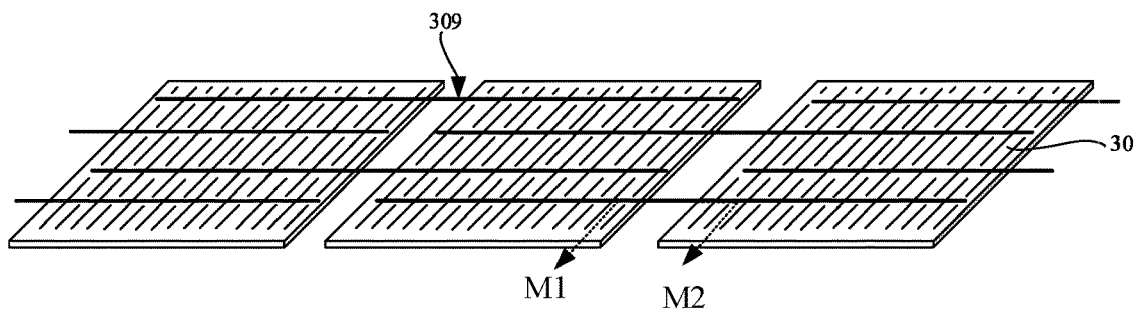
FIG. 19 is a schematic diagram illustrating a structure of a photovoltaic module in accordance with yet another embodiment of the present disclosure.
Figure 20:
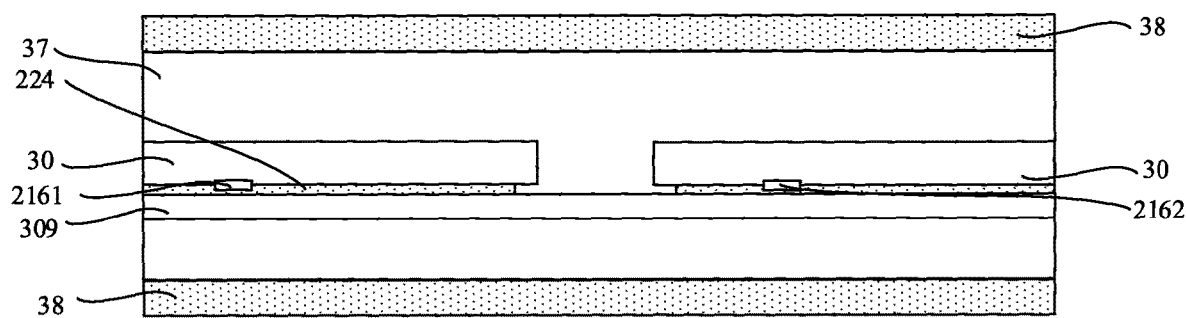
FIG. 20 is a schematic diagram illustrating a cross-sectional structure along a cross section M1-M2 in FIG. 19.

FIG. 19 is a schematic diagram illustrating a structure of a photovoltaic module in accordance with yet another embodiment of the present disclosure. FIG. 20 is a schematic diagram illustrating a cross-sectional structure of FIG. 19 along a cross section M1-M2. In the embodiments of the present disclosure, a photovoltaic module formed by solar cells provided in another embodiment is taken as an example.

Referring to FIG. 19 and FIG. 20, the photovoltaic module includes: at least cell string, formed by connecting the solar cells 30 according to any one of the foregoing embodiments or solar cells 30 prepared by using the method according to any one of the foregoing embodiments; an encapsulation glue film 37, configured to cover a surface of the at least cell string; and a cover plate 38, configured to cover a surface of the encapsulation glue film 37 facing away from the at least cell string.

Specifically, in some embodiments, a plurality of cells may be electrically connected by a connecting member 309. The connecting member 309 is welded to busbars 224 on the cells.

In some embodiments, no gap is provided between the cells. That is, the cells overlap each other.

In some embodiments, the connecting member is welded to fingers on the cells. The fingers include a first electrode 2161 and a second electrode 2162. In some embodiments, the connecting member is welded to busbars 224 on the cells. The busbars include a first busbar and a second busbar. The first busbar is welded to the first electrode 2161, and the second busbar is welded to the second electrode 2162.

In some embodiments, the encapsulation glue film includes a first encapsulation glue film and a second encapsulation glue film. The first encapsulation glue film covers one of a front surface and a back surface of the solar cell, and the second encapsulation glue film covers the other of the front surface and the back surface of the solar cell. Specifically, at least one of the first encapsulation glue film and the second encapsulation glue film may be an organic encapsulation glue film such as a polyvinyl butyral (PVB) glue film, an ethylene-vinyl acetate copolymer (EVA) glue film, a polyolefin elastomer (POE) glue film, or a polyethylene glycol terephthalate (PET) glue film.

It should be noted that a boundary exists between the first encapsulation glue film and the second encapsulation glue film before lamination, and after the photovoltaic module is formed through lamination processing, concepts of the first encapsulation glue film and the second encapsulation glue film do not exist, that is, the first encapsulation glue film and the second encapsulation glue film have formed the entire encapsulation glue film 37.

In some embodiments, the cover plate 38 may be a glass cover plate, a plastic cover plate, or other cover plates having a light transmission function. Specifically, a surface of the cover plate 38 facing the encapsulation glue film 37 may be an uneven surface, thus increasing the utilization rate of incident light. The cover plate 38 includes a first cover plate and a second cover plate. The first cover plate is covered on a side of the first encapsulation glue film facing away from the cell string, and the second cover plate is covered on a side of the second encapsulation glue film facing away from the cell string. Alternatively, the first cover plate is covered on one side of the cell string, and the second cover plate is covered on an opposite side of the cell string.

A person of ordinary skill in the art may understand that, the foregoing implementations are specific embodiments for implementing the present disclosure. During actual application, various changes may be made to the forms and details without departing from the spirit and scope of the embodiments of the present disclosure. Any person skilled in the art may make various variations and modifications without departing from the spirit and scope of the embodiments of the present disclosure. Therefore, the protection scope of the embodiments of the present disclosure should be subject to a scope defined by the appended claims.

What is claimed is:

1. A solar cell, comprising:
a substrate, having a first surface and a second surface opposite to the first surface, the first surface including an edge region and a center region, the edge region surrounding the center region, and the edge region being substantially flush with, or closer to the second surface than, the center region;
a dielectric layer, formed on the center region and not on the edge region;
a doped semiconductor layer, formed over a surface of the dielectric layer facing away from the substrate;
a passivation layer, formed over the edge region and a surface of the doped semiconductor layer facing away from the dielectric layer, the passivation layer including a first portion abutting the edge region and a second portion abutting the surface of the doped semiconductor layer facing away from the dielectric layer; and electrodes, including a first plurality of electrodes formed over the center region and penetrating the second portion of the passivation layer in a thickness direction to be in electrical contact with the doped semiconductor layer;

wherein the center region includes P-regions and N-regions arranged alternatingly, and spacer regions, and each respective spacer region of the spacer regions is between a respective P-region of the P-regions and a respective N-region of the N-regions; the doped semiconductor layer includes a first doped semiconductor layer over the P-regions and a second doped semiconductor layer over the N-regions; the electrodes include first electrodes and second electrodes, the first electrodes are in electrical contact with the first doped semiconductor layer, and the second electrodes are in electrical contact with the second doped semiconductor layer; and the passivation layer further covers a surface of the substrate in the spacer regions.

2. The solar cell according to claim 1, wherein the substrate has a first boundary, and the center region has a second boundary facing the edge region; the first boundary and the second boundary form opposite boundaries of the edge region; and a spacing between the second boundary and the first boundary is less than 300 μm.

3. The solar cell according to claim 1, wherein the substrate has a textured structure in the edge region, and the passivation layer covers the textured structure.

4. The solar cell according to claim 3, wherein the textured structure includes a tower base structure, a pyramid structure, or a platform raised structure.

5. The solar cell according to claim 4, wherein a height difference between a top of the textured structure and the center region is in a range of 1 μm to 14 μm.

6. The solar cell according to claim 1, wherein the substrate has a recessed depth in the edge region with respect to the center region in a range of 1.5 μm to 15 μm.

7. The solar cell according to claim 1, wherein the substrate is provided with a first textured structure in the edge region, the substrate is provided with a second textured structure in the respective spacer region, and the first surface has a roughness in the edge region greater than or equal to that in the respective spacer region.

8. The solar cell according to claim 1, wherein the respective spacer region is substantially flush with the respective P-region and the respective N-region; or, the respective spacer region is closer to the second surface than the respective P-region, and is closer to the second surface than the respective N-region.

9. A photovoltaic module, comprising:
at least one cell string, each formed by connecting solar cells;
an encapsulation glue film, each configured to cover a surface of the at least one cell string; and
a cover plate, configured to cover a surface of the encapsulation glue film facing away the at least one cell string,
wherein each of the solar cells includes:
a substrate, having a first surface and a second surface opposite to the first surface, the first surface including an edge region and a center region, the edge region surrounding the center region, and the edge region being substantially flush with, or closer to the second surface than, the center region;
a dielectric layer, formed on the center region and not on the edge region;
a doped semiconductor layer, formed over a surface of the dielectric layer facing away from the substrate;
a passivation layer, formed over the edge region and a surface of the doped semiconductor layer facing away from the dielectric layer, the passivation layer including a first portion abutting the edge region and a second portion abutting the surface of the doped semiconductor layer facing away from the dielectric layer; and
electrodes, including a first plurality of electrodes formed over the center region and penetrating the second portion of the passivation layer in a thickness direction to be in electrical contact with the doped semiconductor layer;
wherein the center region includes P-regions and N-regions arranged alternatingly, and spacer regions, and each respective spacer region of the spacer regions is between a respective P-region of the P-regions and a respective N-region of the N-regions; the doped semiconductor layer includes a first doped semiconductor layer over the P-regions and a second doped semiconductor layer over the N-regions; the electrodes include first electrodes and second electrodes, the first electrodes are in electrical contact with the first doped semiconductor layer, and the second electrodes are in electrical contact with the second doped semiconductor layer; and the passivation layer further covers a surface of the substrate in the spacer regions.

10. The photovoltaic module according to claim 9, wherein the substrate has a first boundary, and the center region has a second boundary facing the edge region; the first boundary and the second boundary form opposite boundaries of the edge region; and a spacing between the second boundary and the first boundary is less than 300 μm.

11. The photovoltaic module according to claim 9, wherein the substrate has a textured structure in the edge region, and the passivation layer covers the textured structure.

12. The photovoltaic module according to claim 11, wherein the textured structure includes a tower base structure, a pyramid structure, or a platform raised structure.

13. The photovoltaic module according to claim 12, wherein a height difference between a top of the textured structure and the center region is in a range of 1 μm to 14 μm.

14. The photovoltaic module according to claim 9, wherein the substrate has a recessed depth in the edge region with respect to the center region in a range of 1.5 μm to 15 μm.

* * * * *